(12) United States Patent
Casanova et al.

(10) Patent No.: US 8,035,388 B2
(45) Date of Patent: Oct. 11, 2011

(54) METHOD AND APPARATUS FOR PROVIDING A SENSITIVE VOLUME FOR SINGLE-SIDED NMR

(75) Inventors: Federico Casanova, Aachen (DE); Juan Francisco Perlo, Aachen (DE); Bernhard Blumich, Rott (DE)

(73) Assignee: RWTH Aachen, Aachen (DE)

( * ) Notice: Subject to any disclaimer, the term of this patent is extended or adjusted under 35 U.S.C. 154(b) by 0 days.

(21) Appl. No.: 12/500,638

(22) Filed: Jul. 10, 2009

(65) Prior Publication Data

US 2010/0013474 A1    Jan. 21, 2010

Related U.S. Application Data

(63) Continuation of application No. PCT/EP2008/050311, filed on Jan. 11, 2008.

(30) Foreign Application Priority Data

Jan. 11, 2007  (EP) ..................................... 07000556

(51) Int. Cl.
*G01V 3/00* (2006.01)

(52) U.S. Cl. ...................................................... 324/320

(58) Field of Classification Search .......... 324/300–322; 600/410–435
See application file for complete search history.

(56) References Cited

U.S. PATENT DOCUMENTS

| | | | | |
|---|---|---|---|---|
| 3,629,697 A * | 12/1971 | Bouchiat et al. | .............. | 324/301 |
| 4,714,881 A | 12/1987 | Givens | | |
| 4,829,252 A * | 5/1989 | Kaufman | ....................... | 324/309 |
| 5,134,374 A * | 7/1992 | Breneman et al. | ............ | 324/319 |
| 5,432,446 A | 7/1995 | MacInnis et al. | | |
| 5,565,834 A | 10/1996 | Hanley et al. | | |
| 5,786,695 A * | 7/1998 | Amor et al. | .................... | 324/320 |
| 6,097,188 A * | 8/2000 | Sweedler et al. | ............. | 324/321 |
| 6,278,351 B1 * | 8/2001 | Wheatley | ....................... | 335/299 |
| 6,313,634 B1 * | 11/2001 | Kasten | ........................... | 324/320 |
| 6,489,872 B1 | 12/2002 | Fukushima et al. | | |
| 6,534,984 B2 | 3/2003 | Westphal | | |

(Continued)

FOREIGN PATENT DOCUMENTS

DE    20 2006 002074 U1    7/2006

(Continued)

OTHER PUBLICATIONS

Perlo J. et al: "Ex situ NMR in highly homogeneous fields: <1>H Spectroscopy", Science, American Association for the Advancement of Science, US, Washington, DC. vol. 315, No. 5815, Feb. 23, 2007, pp. 1110-1112, XP002437076, ISSN: 0036-8075.

(Continued)

*Primary Examiner* — Dixomara Vargas
(74) *Attorney, Agent, or Firm* — BainwoodHuang

(57) ABSTRACT

An apparatus for providing a sensitive volume for single-sided NMR includes: (i) at least one first permanent magnet for providing a first magnetic field at the sensitive volume; and (ii) at least one of the following means for superimposing at least one second magnetic field for homogenizing the first magnetic field in the sensitive volume: (A) at least one shim magnet, (B) at least one pair of shim magnets, and (C) at least one electrical conductor being connectable to an electric current source. The at least one second magnetic field is adjusted such that the magnetic field homogeneity in the sensitive volume is corresponding to a line width of hydrogen (1H) of less than 10 ppm.

13 Claims, 6 Drawing Sheets

U.S. PATENT DOCUMENTS

| | | | |
|---|---|---|---|
| 6,670,877 B2 * | 12/2003 | Rapoport | 335/296 |
| 6,788,061 B1 * | 9/2004 | Sweedler et al. | 324/321 |
| 6,940,378 B2 * | 9/2005 | Miller et al. | 335/296 |
| 7,358,734 B2 | 4/2008 | Blumich et al. | |
| 7,683,614 B2 * | 3/2010 | Posse | 324/307 |
| 2005/0258924 A1 | 11/2005 | Xia | |
| 2010/0013473 A1 * | 1/2010 | Blumich et al. | 324/307 |

FOREIGN PATENT DOCUMENTS

| | | |
|---|---|---|
| GB | 2 313 444 A | 11/1997 |
| WO | 9418577 A | 8/1994 |
| WO | 9927389 A | 6/1999 |
| WO | 0057435 A | 9/2000 |
| WO | 02056047 A | 7/2002 |
| WO | 2004008168 A | 1/2004 |

OTHER PUBLICATIONS

Blumich, B.; "NMR Imaging of Materials"; 2000, Clarendon Press, Oxford, XP002437141, pp. 415-423 and pp. 509-518.

Marble, A.E., et al.; "An Analytical Methodology for Magnetic Field Control in Unilateral NMR"; Journal of Magnetic Resonance, Academic Press, Orlando, FL, US.; vol. 174, No. 1, May 2005, XP004833775, pp. 78-87.

Manz, et al.; "A Mobile One-Sided NMR Sensor With a Homogeneous Magnetic Field: the NMR-MOLE"; Journal of Magnetic Resonance, Academic Press, Orlando, FL, US.; vol. 183, No. 1, Nov. 7, 2006, XP005723717, pp. 25-31.

* cited by examiner

METHOD AND APPARATUS FOR PROVIDING A SENSITIVE VOLUME FOR SINGLE-SIDED NMR

CROSS REFERENCE TO RELATED APPLICATIONS

This Patent Application is a Continuation of International Patent Application No. PCT/EP2008/050311 filed on Jan. 11, 2008, entitled, "METHOD AND APPARATUS FOR PROVIDING A SENSITIVE VOLUME FOR SINGLE-SIDED NMR", the contents and teachings of which are hereby incorporated by reference in their entirety.

FIELD OF THE INVENTION

Some embodiments are directed to a method and an apparatus for providing a sensitive volume of a homogenous magnetic field for single-sided NMR (Nuclear Magnetic Resonance) e. g. for single-sided NMR spectroscopy which can in particular be used within single-sided or unilateral NMR-devices.

BACKGROUND

NMR is known for several decades to allow non-invasive measurements of a large variety of systems ranging from quantitative analysis of liquid samples to whole body images of the human body. Within the last years beside the usual NMR approach in which a probe is inserted into a homogeneous magnetic field provided e.g. by a super conducting magnet other methods have been implemented which are based on single-sided NMR or unilateral NMR. These techniques are based on the use of the stray field of permanent magnets which create the population differences of the quantum mechanical levels necessary to excite and detect NMR signals. These techniques where developed based on the need to provide NMR methods which allow the measurement of large samples which cannot be implemented into super conducting magnets or which can for other reasons not be moved to a super conducting magnet. These techniques are based on the magnetic field which can be generated on one side of a magnet. In this regions the magnetic field is very inhomogeneous which is a drawback for NMR methods. This results in line widths being relatively broad compared to those of NMR spectra measured in a super conducting magnet. In particular, the line width within the inhomogeneous field of a single-sided NMR magnet is essentially infinite, i. e. larger than 1 MHz whereas the linewidth in conventional high-resolution NMR spectroscopy is usually less than 1 Hz. Therefore, quantitative measurements of NMR spectra using single-sided NMR equipment have been problematic in the past.

Based on this, it is an object of certain embodiments of the present invention to provide a method and an apparatus which overcomes at least in part the problems known from prior art and which in particular allows quantitative measurements of NMR spectra using single-sided NMR equipment.

These objects are accomplished by a method for providing a sensitive volume for single-sided NMR and an apparatus for providing a sensitive volume for single-sided NMR having the features as described herein.

The method for providing a sensitive volume for single-sided NMR according to certain embodiments of the present invention includes:
   a) generating a first magnetic field at the sensitive volume by at least one first permanent magnet and
   b) superimposing at least one second magnetic field for homogenizing the first magnetic field in the sensitive volume, said second magnetic field being generated by at least one of the following:
      A) at least one shimming magnet;
      B) at least one pair of shimming magnets; and
      C) at least one electrical conductor flown through by electric current whereas the at least one second magnetic field is adjusted such that the magnetic field homogeneity in the sensitive volume is corresponding to a line width of hydrogen ($^1$H) of less then 10 ppm (parts per million).

In particular it is advantageous that one first permanent magnet is used which is composed by several magnet blocks. The term single-sided NMR is in particular to be understood such that the sensitive volume is situated outside i. e. on one side of the magnet and is not surrounded by the at least one permanent magnet. Superimposing at least one second magnetic field to the first magnetic field in such a way that the first magnetic field is homogenized by the at least one second magnetic field leads to an increased homogeneity of the static magnetic field within the sensitive volume. This allows for the first time the measurement of spectroscopic data or spectroscopically resolved data without applying sophisticated pulse sequences. With the method according to certain embodiments of the present invention it was possible to achieve a chemical resolution of less than 10 ppm, preferably of less than 1 ppm so that different molecular structures such as toluene and acetic acid could be resolved. It is possible to enhance the spectroscopic resolution by the method according to certain embodiments of the invention by a factor of about 30 or even more with respect to prior art.

Furthermore, a method for performing single-sided NMR measurements is advantageous in which
   a) a first magnetic field is generated by at least one permanent magnet;
   b) at least one second magnetic field for homogenizing the first magnetic field is superimposed to the first magnetic field so that the magnetic field at least in a sensitive volume is homogenized whereas said second magnetic field is generated by at least one of the following:
      A) at least one shimming magnet;
      B) at least one pair of shimming magnets; and
      C) at least one electrical conductor flown through by electric current,
wherein the at least one second magnetic field is adjusted such that the magnetic field inhomogeneity in the sensitive volume is corresponding to a line width of hydrogen of less than 10 ppm.

In particular a sample which extends at least in part across the sensitive volume is excited by at least one excitation coil which can be driven by a respective NMR spectrometer like e.g. the BRUKER minispec. Using this excitation coil which is e.g. a surface coil the spins in the sample can be excited by at least one RF (radio frequency)-pulse. The same RF-coil can be used to sample the NMR signal generated within the sample. Preferably, the first magnetic field is generated such that it is parallel to the excitation coil.

The improvements disclosed within this document directed to a method for providing a sensitive volume for single-sided NMR can in an advantageous way be transferred to and used with the method for measuring NMR data disclosed within this document and vice versa.

According to an advantageous improvement of certain embodiments of the present invention the shimming magnets include permanent magnets.

In particular it was found to be useful to use neodymium iron boron (NdFeB) as permanent magnets. Independent thereof the use of permanent magnets like SmCo magnets (samarium cobalt magnets) as a permanent magnet to generate the first magnetic field and/or to generate the second magnetic field is advantageous.

According to a further advantageous improvement of certain embodiments of the present invention, step b) includes superimposing the fields of four pairs of shimming magnets and three electrical conductors.

This improvement has to be found in particular useful, as the usual polynomial components of the shimming magnetic field can be influenced independently by the shim magnets and the electrical conductors. In particular the pairs of shim magnets include each a pair of magnet blocks with opposite polarisation. The pairs of shim magnets are suitably arranged with respect to the main magnet in particular in two layers each including four shim magnets.

According to yet a further improvement of certain embodiments of the present invention step b) includes at least one of the following measures:
  i) moving at least one of the shimming magnets; and
  ii) changing the electric current flowing with at least one conductor.

It is to be understood that the electric current which is used to superimpose at least one second magnetic field for homogenizing the first magnetic field is a direct current (DC). This direct current generates a static magnetic field which is superimposed to the static first magnetic field. By an appropriate position of the at least one shimming magnet and/or an appropriate choice of the at least one electric current, a homogenization of the first magnetic field is reachable which leads to the ability to measure proton spectra with single-sided NMR having a spectral resolution of 0.25 ppm and less.

According to a further aspect of certain embodiments of the invention an apparatus for providing a sensitive volume for single-sided NMR is proposed which includes:
  i) at least one first permanent magnet for providing a first magnetic field at the sensitive volume;
  ii) at least one of the following means for superimposing at least one second magnetic field for homogenizing the first magnetic field in sensitive volume:
     A) at least one shimming magnet;
     B) at least one pair of shimming magnets; and
     C) at least one electrical conductor being connectable to an electric current source
wherein the means for superimposing at least one second magnetic field are adjustable in such a way that the magnetic field inhomogeneity in the sensitive volume is corresponding to a line width of hydrogen of less than 10 ppm.

The apparatus according to certain embodiments of the present invention can in particular be part of a single-sided NMR device which further includes in particular an exciting and receiving coil for a RF excitation and detection of the sample within the sensitive volume and a NMR spectrometer to generate and send and to receive the pulses to and from the sample within the sensitive volume. Preferably the means for superimposing at least one second magnetic field are adjustable such that the magnetic field inhomogeneity in the sensitive volume is corresponding to a line width of hydrogen of less than 1 ppm.

The apparatus according to certain embodiments of the present invention allows for the first time to measure NMR spectra of large samples using single-sided NMR without the implementation of sophisticated pulse sequences but by using generally known pulse sequences like e.g. the Hahn- or spin-echo-sequence or the like. In particular one can restrain from the use of e.g. nutation-echoes or the like. For the first time it is possible to generate a relatively homogeneous field ex situ on one single side of the first permanent magnet used to create the basic magnetic field. Conventional NMR magnets which enclose the sample are equipped with shim coils to change the shape of the polarising magnetic field to extreme homogeneity to measure NMR spectra with small line widths. The straightforward adoption of this approach to shim the stray field of an ex situ sensor by respective shim coils is not suitable as excessive requirements for shim currents have to be taken into account. The solution according to certain embodiments of the present invention which is based in particular on a combination of the fields generated by permanent shimming magnets and the fields of electric conductors like e.g. surface coils driven by an electric current, in particular a direct current, preferable for fine tuning the field is advantageous and allows for the first time reasonable measurements of NMR spectra or spectral resolved NMR data using single-sided NMR equipment.

According to an advantageous improvement of certain embodiments of the present invention, the means for superimposing at least one second magnetic field for homogenizing the first magnetic field in the sensitive volume includes four pairs of shimming magnets. Preferably, each pair includes two magnets of anti-parallel polarity.

It is in particular advantageous if two pairs of shimming magnets are fixed near or at the bottom of the first permanent magnet or are only slightly adjustable and two further pairs are mounted moveably above the first two pairs of shimming magnets. The first two pairs which are situated at the bottom produce a strong magnetic gradient field in the depth direction. These four pairs of shimming magnets generate a total of eight shim components. The first order shim components x, y and z are generated by displacing the two moveable pairs along the x, y and z directions, respectively. The second order terms $x^2$ and $y^2$ are adjusted by varying the distance between the pairs while keeping their centers fixed with respect to the first permanent magnet. Moreover, cross-terms xy, xz, and yz can also be generated by displacing the magnets. It is in particular advantageous if three single-sided coils generating x, y, and z gradient fields are implemented which can be used for fine tuning the field.

According to a further improvement of certain embodiments of the present invention a first and a second pair of the shimming magnets have a constant position relative to the first permanent magnet.

According to yet a further improvement of certain embodiments of the present invention the positions of a third and fourth pair of shimming magnets is adjustable in at least one of the following aspects:
  a) the position of the respective pair of shimming magnets relative to the first permanent magnet;
  b) the position of at least one of the magnets of the respective pair of shimming magnets relative to the first permanent magnet; and
  c) the position of the shimming magnets of at least one of the pair of the shimming magnets while the position of the central point between the respective pair of shimming magnets is remained constant relative to the first permanent magnet.

This allows the change of x, y, z, $y^2$, $z^2$, xy, xz, and/or yz components of the shim field.

According to yet another improvement of certain embodiments of the present invention the means for superimposing at least one second magnetic field for homogenizing the first magnetic field the sensitive volume includes three pairs of conductors.

In particular it is possible to build the three conductors as three single-sided coils which generate x, y, and/or z components of the shim field.

According to yet another advantageous improvement of the apparatus according to certain embodiments of the present invention at least one of the conductors includes a surface coil.

Surface coils are in particular useful to generate shim fields on the outside of the magnet which is in an ex situ situation.

According to yet another advantageous improvement at least one shim magnet is provided such, that a temperature shift of the first magnetic field in the sensitive volume is compensated by a temperature shift of the second magnetic field in the sensitive volume provided by the respective shim magnet. It is preferred in this context that the first permanent magnet includes neodymium iron boron (NdFeB) and at least one shim magnet includes samarium cobalt (SmCo).

It is understood in this context that the shift of the magnetic fields is in particular a shift of fields i. e. field strengths with changing temperature. Preferably all shim magnets are temperature compensating which means e. g. that the at least one first permanent magnet includes NdFeB whereas all shim magnets include SmCo or the at least one first permanent magnet includes SmCo whereas at least two pairs and preferably four pairs of shim magnets are made of NdFeB. The combination of these two materials reduces the temperature shift within the apparatus 1 according to certain embodiments of the present invention significantly e.g. by a factor of about 100.

It is preferred that the first permanent magnet is made from a material having a first temperature coefficient k1 determining the field drift of the first magnetic field B0,1 of the first permanent magnet whereas at least two pairs of the shim magnet and preferably four pairs of shim magnets are made from a material having a second temperature coefficient k2 determining the field drift of the second magnetic field B0,2, so that the magnetic field in the sensitive volume being B0,1=A B0,2, said temperature coefficients being related by A k1=k2.

The details and advantages disclosed for the method for providing a sensitive volume for single-sided NMR are transferable and applicable to the apparatus for providing a sensitive volume for single-sided NMR and vice versa. The same holds for details and advantages disclosed for the method for measuring NMR data, which are transferable and applicable to the method for providing a sensitive volume for providing a single-sided NMR, to the apparatus for providing a sensitive volume for single-sided NMR, as well as to the apparatus for measuring NMR data and vice versa, respectively.

BRIEF DESCRIPTION OF THE DRAWINGS

The invention is further described in the following by way of example with reference to the accompanying drawings in which FIG. 1 a first view of a first embodiment of an apparatus according to the invention.

DETAILED DESCRIPTION

Figure 1:
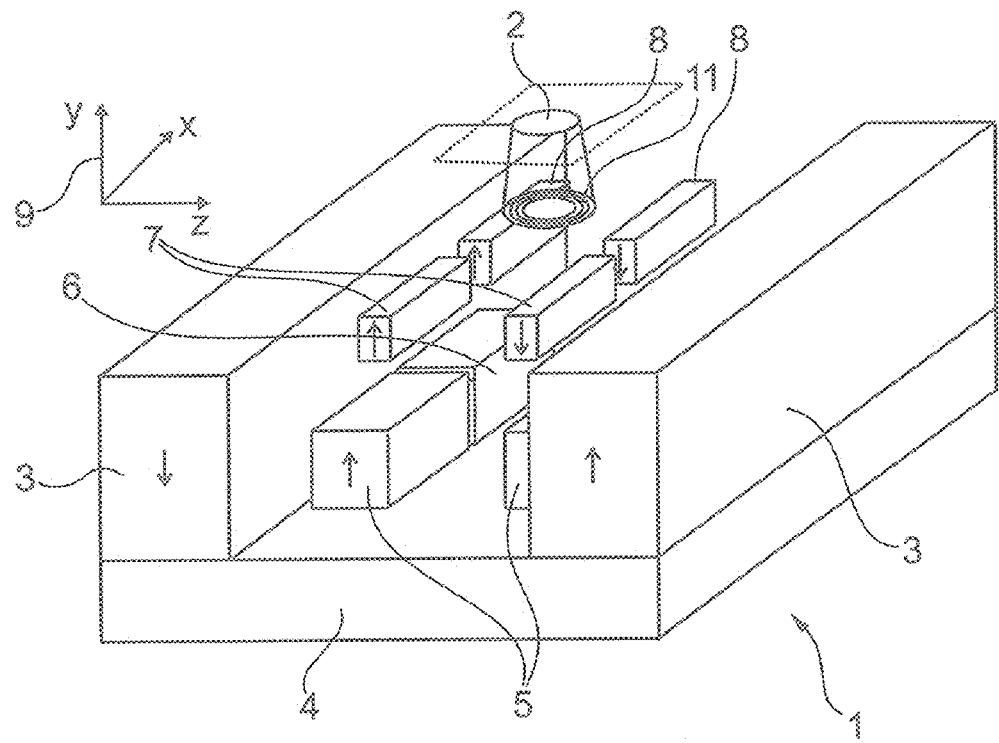

FIG. 1 displays a first view on a first embodiment of an apparatus 1 for providing a sensitive volume 2 for single-sided NMR. The apparatus 1 includes two first permanent magnets 3 for providing a first magnetic field at the sensitive volume 2. The two first permanent magnets 3 are arranged such that their polarity is anti-parallel. The two first permanent magnets 3 are arranged on an iron yoke 4 connecting the two first permanent magnets 3. Above the yoke 4 and in between the two first permanent magnets 3 the apparatus 1 further includes a first pair 5 of shim magnets, a second pair 6 of shim magnets, a third pair 7 of shim magnets and a fourth pair 8 of shim magnets. In this context the first 5 and second pair 6 of shim magnets have a constant position relative to the first permanent magnets 3 whereas the position of the third 7 and fourth pair 8 of shim magnets can be adjusted relative to the first permanent magnets 3. The constant position of the first 5 and second pair 6 of shim magnets are set such that a first order correction of the homogeneity of the magnetic field in the sensitive volume 2 is performed. The reference numeral 9 depicts the coordinate frame which is used throughout this document. The shim field can be understood as a second order polynomial expansion regarding the coordinates x, y, z depicted in the coordinate frame 9. The shim component x, for example, is the contribution to the shim field regarding the coordinate x. The mixed terms, like e. g. the xy term, are the coefficients of xy within the polynomial expansion and so forth. The expansion can be displayed as $$B = B0 + ax + by + cz + dxy \ldots$$

whereas the coefficients a, b, c, ... are the shim terms referred to in this application. B denotes the overall static magnetic field, in particular within the sensitive volume. B0 denotes the field of the first permanent magnet.

Furthermore, an RF coil 11 for excitation and detection of signals in and from the sensitive volume 2 is further situated on the side opposite to the yoke 4. The RF coil 11 is a surface coil with an outer diameter set to define the lateral dimensions of the volume 2. Moreover, to restrict the thickness of the sensitive volume 2 along the depth a slice selection technique that combines the application of soft (i. t. shaped or non-rectangular) RF pulse with the application of a pulsed gradient along the depth is used. This volume selection is advantageous to detect signal only from the volume where high field homogeneity is achieved.

The first 5 and second pair 6 of shim magnets are fixed at the bottom near the iron yoke 4 whereas the third 7 and fourth pair 8 of shim magnets are disposed above the first 5 and second pair 6 of shim magnets. The first 5 and second pair 6 of shim magnets generate a strong magnetic field gradient along the depth direction y. These four pairs 5, 6, 7, 8 of shim magnets generate a total of eight shim components. The first order shim components x, y, and z are generated by displacing the third 7 and fourth pair 8 of shim magnets along the x, y and z directions, respectively. The second order shim terms $x^2$ and $z^2$ are adjusted by varying the distance between the third 7 and fourth pairs 8 of shim magnets while keeping their middle position fixed with respect to the first permanent magnets 3. Furthermore, cross-terms xy, xz and yz can also be generated by displacing the magnets of the third 7 and fourth pair 8 of shim magnets as can be seen in the following:

| Shim Component | Direction of Displacement of Magnet | | | |
|---|---|---|---|---|
| | No. 1 | No. 2 | No. 3 | No. 4 |
| x | x | x | x | x |
| y | y | y | y | y |
| z | z | z | z | z |
| $x^2$ | x | x | −x | −x |
| $z^2$ | z | −z | z | −z |
| xy | −y | −y | y | y |
| zy | y | −y | y | −y |
| xz | x | −x | x | −x |

Figure 2:
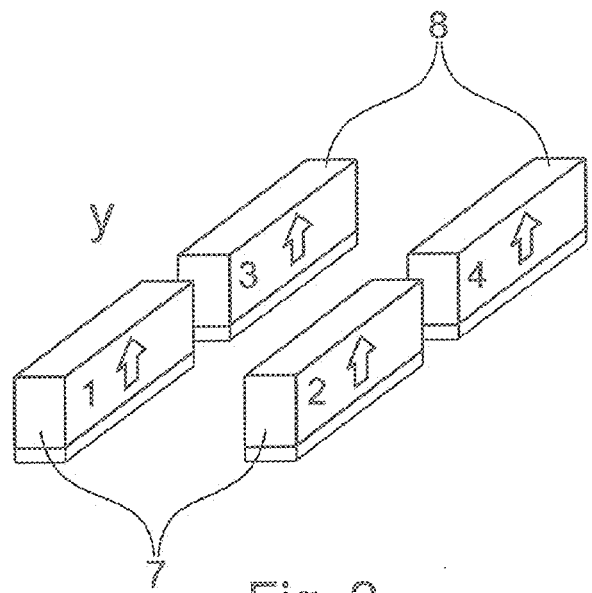
FIG. 2 first examples of pairs of shim magnets and their relative movement.

Therein the number of the magnet is used as disclosed in FIG. 2. FIG. 2 displays the third 7 and fourth pair 8 of shim magnets in the same configuration as can be seen in FIG. 1. This means, the third pair 7 of shim magnets includes magnets no. 1 and 2 whereas the fourth pair 8 of shim magnets includes magnets 3 and 4. FIG. 2 discloses the direction of displacement to change the y component of the shim field.

Figure 3:
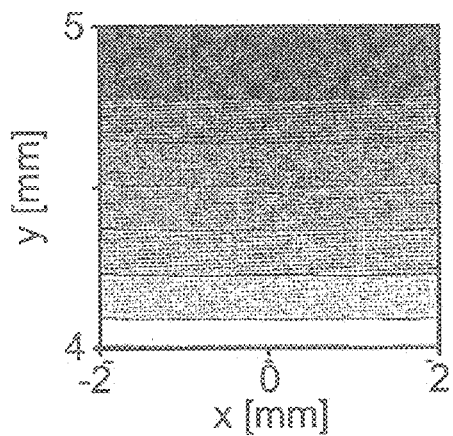
FIG. 3 the shim field component resulting from the movement according to FIG. 2.
Figure 5:
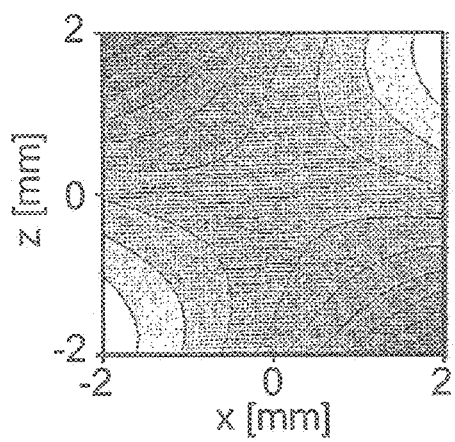
FIG. 5 the shim field component resulting from the movement according to FIG. 4.
Figure 4:
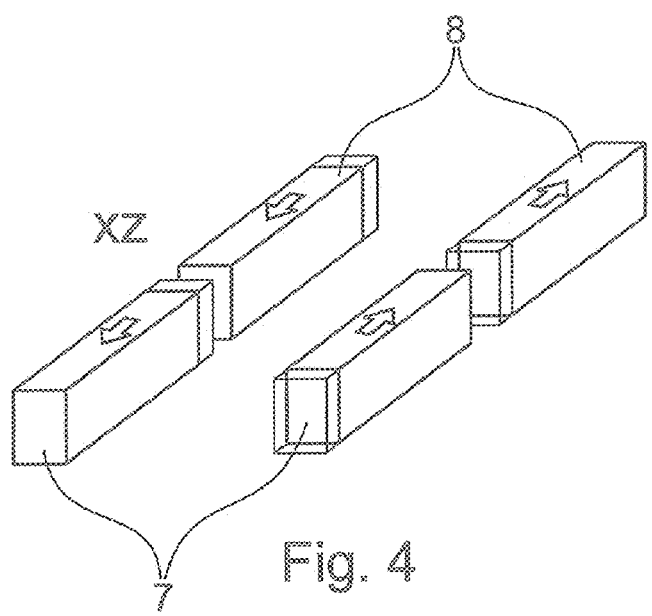
FIG. 4 a second example of the movement of pairs of shim magnets.
Figure 6:
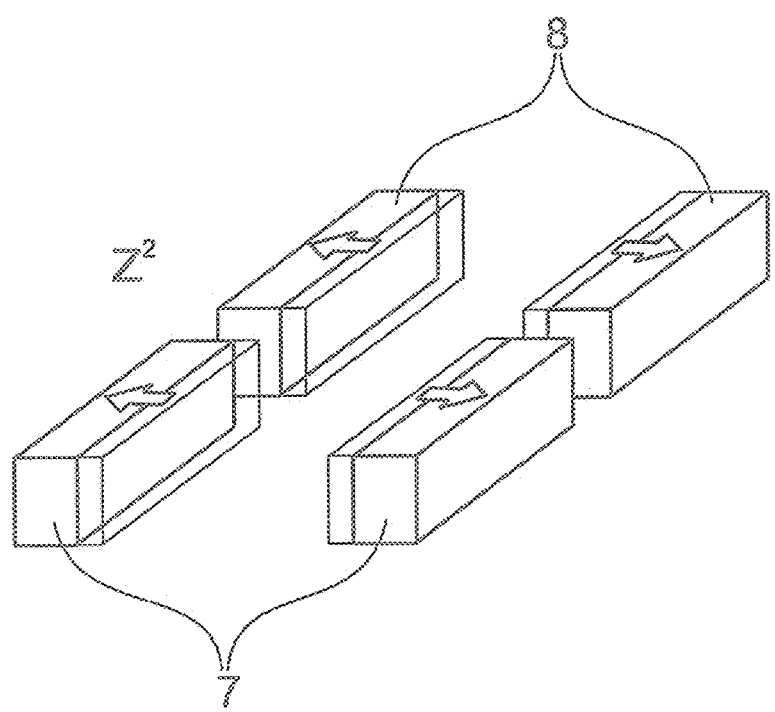
FIG. 6 a third example of the movement of pairs of shim magnets.
Figure 7:
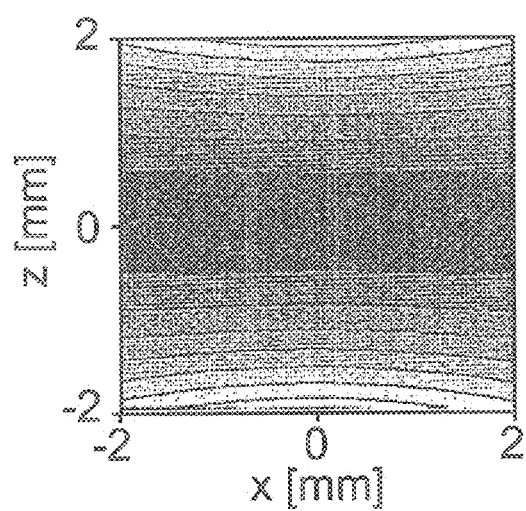
FIG. 7 the shim field component resulting from the movement according to FIG. 6.

FIG. 3 displays the effect of moving the third 7 and fourth pair 8 of shim magnets as depicted in FIG. 2 by means of maps of the magnitude of the magnetic field. Field strength increases are indicated by color changes from black to white. The same holds for FIGS. 5 and 7, which depict the effect of moving the third 7 and fourth pair 8 of shim magnets as depicted by the arrows in FIGS. 4 and 6. The movement according to FIG. 4 allows adjustment of the xz component of the shim field, whereas the movement according to FIG. 6 allows adjustment of the $z^2$ component of the shim field.

Figure 8:
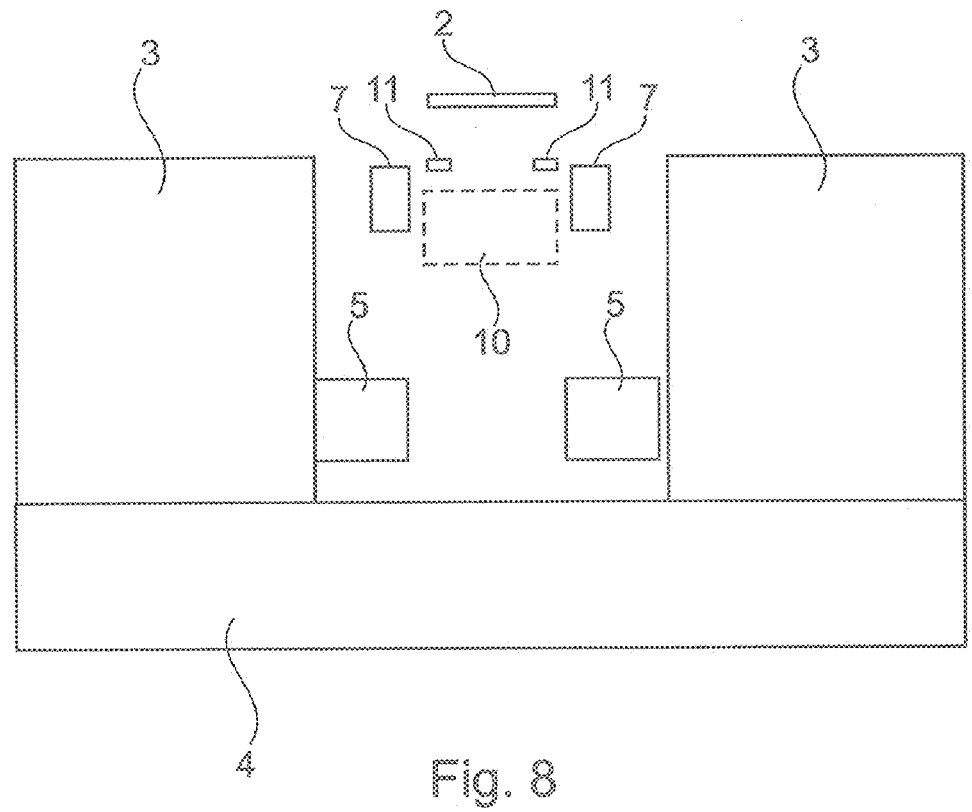
FIG. 8 a cross-section of a second embodiment of an apparatus according to the invention.

FIG. 8 displays a cross-section a second embodiment of an apparatus 1 according to certain embodiments of the present invention, wherein the same reference numerals are used as in FIG. 1. The second embodiment of apparatus 1 includes mainly the same elements as the first embodiment of the apparatus according to certain embodiments of the invention shown in FIG. 1. Additionally to the first permanent magnets 3, the yoke 4, the first pair 5 of shim magnets, and the third pair 7 of shim magnets which are displayed in this cross-section, the second embodiment includes furthermore three shim coils which are situated within the shim coil region 10. The second embodiment includes a RF-coil 11 as the first embodiment displayed in FIG. 1.

Figure 9:
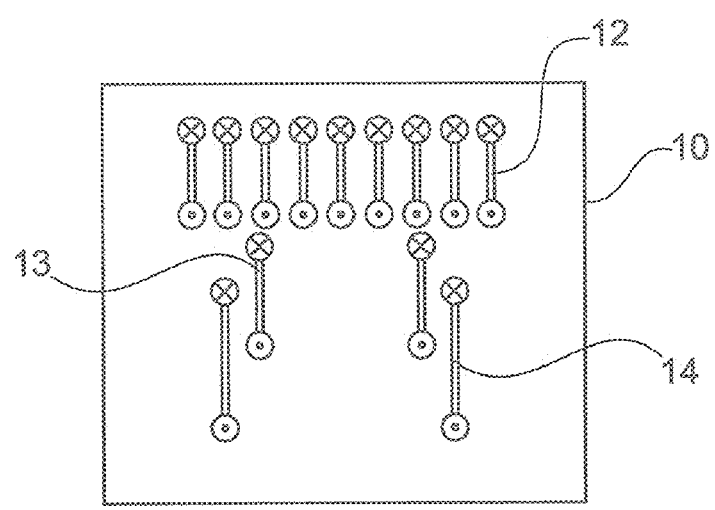
FIG. 9 a respective view of the shim coils of the second embodiment.

FIG. 9 shows a close-up view of the shim coil region 10 as shown in FIG. 8. The topmost first shim coil 12 is used to modify the x component of the shim field Below the first shim coil 12 a second shim coil 13 and a third shim coil 14 are situated. The second shim coil is situated within the third shim coil 14 and in part above the third shim coil 14. The second shim coil 13 is used to alter the y component of the shim field. The third shim coil 14 is used to change the z component of the shim field. With the shim coils 12, 13, 14 it is possible to fine tune the second magnetic field which is generated by the coils 12, 13, 14 and/or the shim magnets 5, 6, 7, 8. In particular it is inter alia possible by use of the shim coils 12, 13, 14 to fine tune the magnetic field within the sensitive volume 2 towards a high homogeneity.

Figure 10:
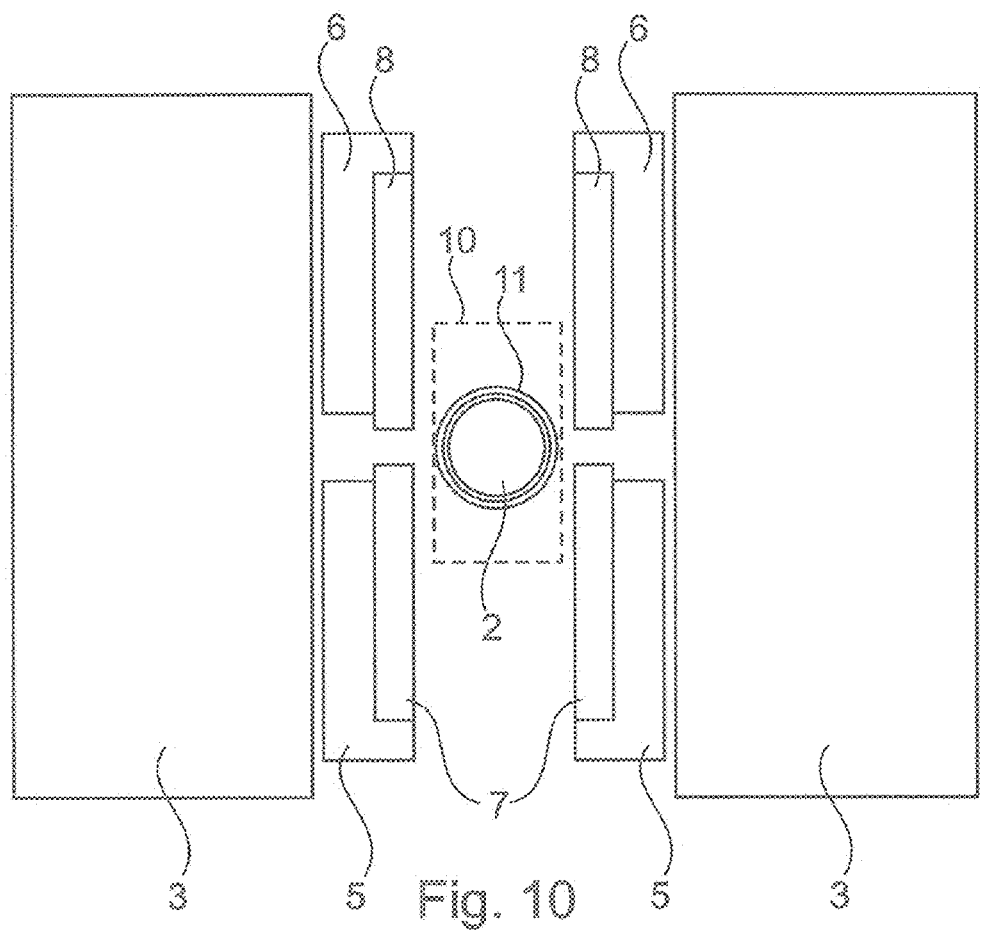
FIG. 10 a top view on the second embodiment of an apparatus according to the invention.
Figure 11:
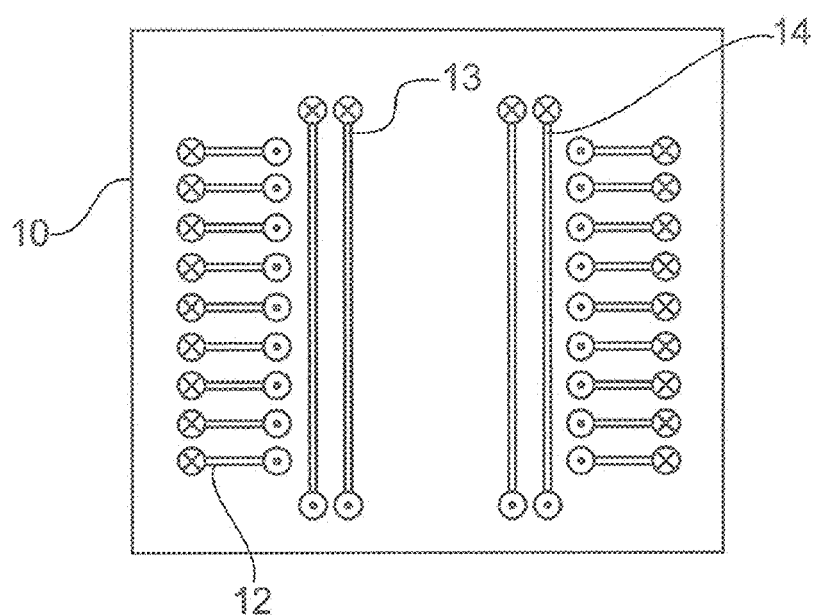
FIG. 11 a respective view on an example of shim coils.

FIGS. 10 and 11 display the same second embodiment of the apparatus 1 according to certain embodiments of the present invention from a top-view for better clarity without the display of the iron yoke 4. From this top-view, in particular from FIG. 11, it can be seen that the second 13 and third shim coil 14 are positioned within the first shim coil 12.

Figure 12:
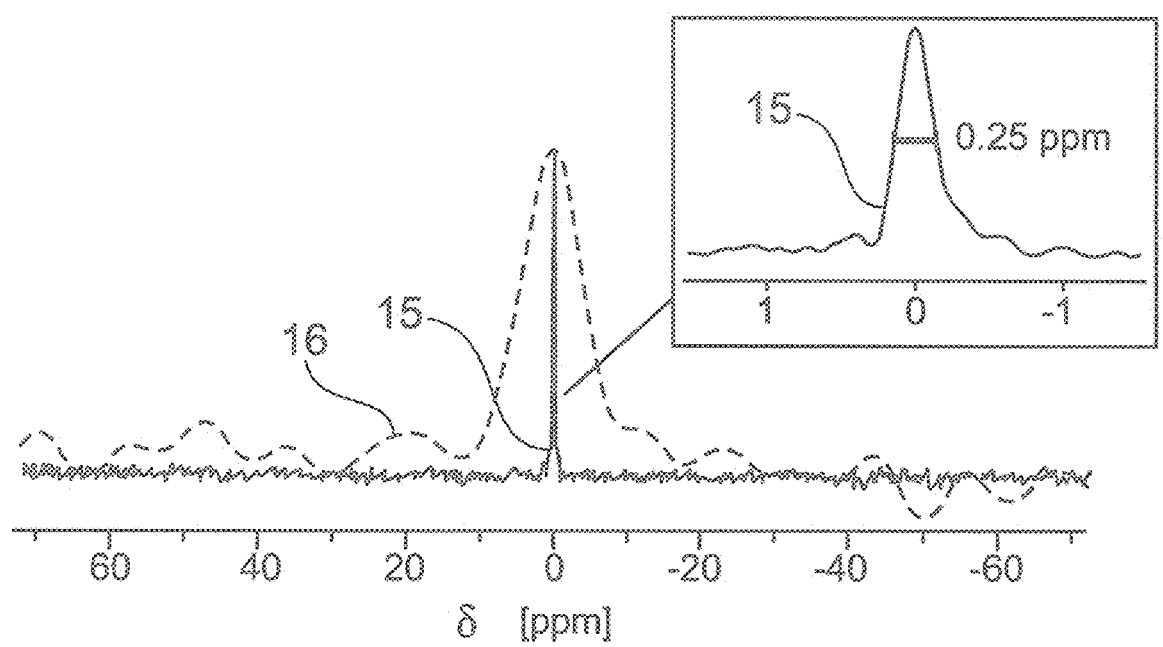
FIG. 12 NMR spectra received with a device according to prior art compared to a NMR spectra received with an apparatus according to the present invention.

FIG. 12 displays two NMR spectra. These spectra were measured on proton resonance (8.33 MHz) on a water sample much larger than the sensitive volume 2 which means that the sample was an arbitrarily large sample placed on top of the apparatus 1. The first spectrum 15 was measured using an apparatus according to the invention whereas the second spectrum 16 was measured with a single-sided NMR apparatus known from prior art. The line width of the first spectrum 15 is 2.2 Hz corresponding to a spectral resolution of about 0.25 ppm. For comparison, the state of the art spectrum 16 for single-sided NMR, measured recently by means of nutation echoes in the presence of spatially matched static and RF fields is shown as well. The spectral resolution has been improved by a factor of about 30 with a concomitant fivefold extension of the excited volume. Together with a sensitivity-optimized surface RF-coil 11 the increased size of the sensitive volume 2 leads to higher signal-noise ratio (SNR).

The sub ppm resolution achieved using an apparatus 1 and a method according to the present invention allows resolving different molecular structures such as e.g. toluene and acetic acid. It is furthermore advantageous to provide the first permanent magnets 3 and the shim magnets 5, 6, 7, 8 of different materials. In particular it is advantageous to choose the materials of the magnets such, that the ratio of the contribution of the respective materials to the total field within the sensitive volume are the negative inverse of the ratio of the respective temperature coefficients which determine the field drift with temperature of the respective materials. It is furthermore preferred within this context to use SmCo as the material to build the first permanent magnets 3 and to use NdFeB to build the shimming magnets 5, 6, 7, 8. The combination of these two materials reduces the temperature shift within the apparatus 1 according to the present invention significantly e.g. by a factor of about 100.

The apparatus 1 according to the present invention includes in particular pairs of shim magnets 5, 6, 7, 8 made from NdFeB having a remnant polarisation of about 1.4 Tesla. This material is used to build up the first permanent magnets 3 as well in a preferred embodiment. The first spectrum 15 displayed in FIG. 12 was measured by a 90° soft pulse for excitation. With this pulse a slice of 0.5 mm thickness was selected using the lateral selection of the surface RF-coil 11. The diameter of the selective volume is 5 mm by 5 mm along the lateral direction and 0.5 mm across. The selective volume 2 is situated within the experiment which led to the first spectrum 15 abound 2 mm above the RF-coil 11 surface.

The method and apparatus to provide a selective volume 2 according to certain embodiments of the present invention allow the generation of highly homogeneous fields within the sensitive volume of single-sided magnets. This considerably expands the methodology available for open NMR sensors. Ex situ $^1$H spectroscopy can be employed for non-invasive screening of molecular compositions, control of chemical reactions and the identification of target compounds. The most significant advantage of having high field homogeneity available for ex situ NMR is that the established techniques of multi-dimensional NMR spectroscopy and imaging can now be implemented in a straightforward way for non-destructive testing of large objects. Certain embodiments of the invention can be applied to other numbers and geometries of first permanent magnets 3 without leaving the inventive concept.

| | List of reference numerals |
|---|---|
| 1 | apparatus for providing a sensitive volume for single-sided NMR |
| 2 | sensitive volume |
| 3 | first permanent magnet |
| 4 | yoke |
| 5 | first pair of shimming magnets |
| 6 | second pair of shimming magnets |
| 7 | third pair of shimming magnets |
| 8 | fourth pair of shimming magnets |
| 9 | coordinate frame |
| 10 | shimming coil region |
| 11 | RF-coil |
| 12 | first shimming coil |
| 13 | second shimming coil |
| 14 | third shimming coil |
| 15 | first spectrum |
| 16 | second spectrum |

What is claimed is:

1. Method for providing a sensitive volume for single-sided NMR, comprising
   a) generating a first magnetic field at the sensitive volume by at least one first permanent magnet and
   b) superimposing at least one second magnetic field for homogenizing the first magnetic field in the sensitive volume the at least one second magnetic field being generated by a shimming means for superimposing at least one second magnetic field:
   wherein the at least one second magnetic field is adjusted to provide a magnetic field homogeneity in the sensitive volume is corresponding to a line width of hydrogen ($^1$H) of less than 10 ppm (parts per million); and wherein the at least one first permanent magnet and the shimming means for superimposing at least one second magnetic field form part of a single-sided NMR apparatus which is constructed and arranged to perform single-sided NMR spectroscopy.

2. Method according to claim 1, wherein the shimming means for superimposing at least one second magnetic field includes permanent magnets.

3. Method according to claim 1, wherein step b) comprises superimposing the fields of four pairs of shim magnets and three electrical conductors.

4. Method according to claim 1, wherein step b) comprises at least one of the following measures:
   i) moving the shimming means for superimposing at least one second magnetic field; and
   ii) if the shimming means for superimposing at least one second magnetic field includes at least one electrical conductor flown through by electric current, changing the electric current flowing through at least one conductor.

5. Method according to claim 1, wherein superimposing the at least one second magnetic field includes adding a first order correction field and a second order correction field to the first magnetic field generated by the at least one first permanent magnet belonging to the single-sided NMR apparatus.

6. Apparatus for providing a sensitive volume for single-sided NMR, comprising:
   i) at least one first permanent magnet for providing a first magnetic field at the sensitive volume;
   ii) shimming means for superimposing at least one second magnetic field for homogenizing the first magnetic field in the sensitive volume
   wherein the shimming means for superimposing at least one second magnetic field is adjustable to provide magnetic field homogeneity in the sensitive volume is corresponding to a line width of hydrogen ($^1$H) of less than 10 ppm (parts per million; and wherein the at least one first permanent magnet and the shimming means for superimposing at least one second magnetic field form part of a single-sided NMR device which is constructed and arranged to perform single-sided NMR spectroscopy.

7. Apparatus according to claim 6, wherein the shimming means for superimposing at least one second magnetic field includes four pairs of shim magnets.

8. Apparatus according to claim 7, wherein the positions of a third and fourth pair of shim magnets is adjustable in at least one of the following aspects:
   a) the position of the respective pair of shim magnets relative to the first permanent magnet;
   b) the position of at least one of the magnets of the respective pair of shim magnets relative to the first permanent magnet; and
   c) the position of the shim magnets of at least one of the pair of shim magnets while the position of the central point between the respective pair of shim magnets is remained constant relative to the first permanent magnet.

9. Apparatus according to claim 6, wherein the shimming means for superimposing at least one second magnetic field includes three pairs of conductors.

10. Apparatus according to claim 9, wherein at least one of the conductors comprises a surface coil.

11. Apparatus according to claim 6, wherein the shimming means for superimposing at least one second magnetic field includes at least one shim magnet; and wherein the at least one shim magnet is provided such that a temperature shift of the first magnetic field in the sensitive volume is compensated by a temperature shift of the second magnetic field in the sensitive volume provided by the respective shim magnet.

12. Apparatus according to claim 11, wherein the first permanent magnet comprises neodymium iron boron (NdFeB) and at least one shim magnet comprises samarium cobalt (SmCo).

13. Apparatus according to claim 7, wherein the shimming means for superimposing at least one second magnetic field includes at least two pairs of shim magnets; wherein the first permanent magnet comprises samarium cobalt (SmCo) and at least two pairs of the shim magnets comprise neodymium iron boron (NdFeB).

* * * * *

UNITED STATES PATENT AND TRADEMARK OFFICE
CERTIFICATE OF CORRECTION

| | | |
|---|---|---|
| PATENT NO. | : 8,035,388 B2 | Page 1 of 1 |
| APPLICATION NO. | : 12/500638 | |
| DATED | : October 11, 2011 | |
| INVENTOR(S) | : Casanova et al. | |

It is certified that error appears in the above-identified patent and that said Letters Patent is hereby corrected as shown below:

Claim 1, Column 9, Line 33, "volume is corresponding to a line width of hydrogen" should read --volume corresponding to a line width of hydrogen--

Claim 6, Column 10, Lines 8-17, "wherein the shimming means for superimposing at least one second magnetic field is adjustable to provide magnetic field homogeneity in the sensitive volume is corresponding to a line width of hydrogen ($^1$H) of less than 10 ppm (parts per million; and wherein the at least one first permanent magnet and the shimming means for superimposing at least one second magnetic field form part of a single-sided NMR device which is constructed an arranged to perform single sided NMR spectroscopy." should read --wherein the shimming means for superimposing at least one second magnetic field is adjustable to provide magnetic field homogeneity in the sensitive volume corresponding to a line width of hydrogen ($^1$H) of less than 10 ppm (parts per million); and wherein the at least one first permanent magnet and the shimming means for superimposing form part of a single-sided NMR device which is constructed an arranged to perform single sided NMR spectroscopy.--

Claim 13, Column 10, Line 49, "Apparatus according to claim 7, wherein the shimming" should read --Apparatus according to claim 6, wherein the shimming--

Signed and Sealed this
Sixth Day of December, 2011

David J. Kappos
*Director of the United States Patent and Trademark Office*